United States Patent [19]

Kurita et al.

[11] Patent Number: 5,251,035
[45] Date of Patent: Oct. 5, 1993

[54] SATELLITE BROADCASTING TUNER

[75] Inventors: Tadashi Kurita; Osamu Yamakami, both of Kanagawa, Japan

[73] Assignee: Sony Corporation, Tokyo, Japan

[21] Appl. No.: 744,520

[22] Filed: Aug. 13, 1991

[30] Foreign Application Priority Data

Aug. 17, 1990 [JP] Japan ................................ 2-215743

[51] Int. Cl.[5] ............................ H04N 5/44; H04N 5/50
[52] U.S. Cl. ................................. 358/188; 358/191.1; 358/86; 358/193.1; 455/338
[58] Field of Search ... 358/188, 181, 189, 191.1–195.1, 358/86, 84; 380/13, 15, 20, 10; 455/182, 141, 183, 338

[56]        References Cited
           U.S. PATENT DOCUMENTS

| 4,667,243 | 5/1987 | Blatter et al. | 358/191.1 |
| 4,823,387 | 4/1989 | Tults | 358/193.1 |
| 4,996,597 | 2/1991 | Duffield | 358/194.1 |
| 5,031,045 | 7/1991 | Kawasaki | 358/191.1 |
| 5,083,205 | 1/1992 | Arai | 358/191.1 |
| 5,087,977 | 2/1992 | Suizu | 358/193.1 |

*Primary Examiner*—Victor R. Kostak
*Assistant Examiner*—Michael H. Lee
*Attorney, Agent, or Firm*—Lewis H. Eslinger; Jay H. Maioli

[57] ABSTRACT

A satellite broadcasting tuner with which satellite broadcasting of any channel can be enjoyed only by a channel selecting operation thereof whether or not broadcasting of the channel involves special signal processing. The tuner includes external input terminals for receiving video and aural signals from an external decoding apparatus, a changing over circuit for alternatively coupling video and aural signals from the external input terminals or video and aural signals from a signal processing circuit, which extracts such video and aural signals from an output of a demodulating circuit for a received satellite broadcasting signal, to external output terminals of the tuner to which an external monitor apparatus is connected, a memory for storing therein channels of satellite broadcasting which is broadcast in a specially processed signal form, and a controller for controlling the changing over circuit to couple, when one of the channels stored in the memory is to be received, the external decoding apparatus to the external monitor apparatus.

2 Claims, 3 Drawing Sheets

SATELLITE BROADCASTING TUNER

BACKGROUND OF THE INVENTION

1. Field of the Invention

This invention relates to a satellite broadcasting tuner.

2. Description of the Prior Art

As a pay system is employed for reception of satellite broadcasting, broadcasting of a video signal in a scrambled condition is employed by some satellite broadcasting channels. If broadcasting in a scrambled condition is employed by a channel, then mere reception of broadcasting of the channel by way of a satellite broadcasting tuner will not allow a video image to be displayed on a monitor screen.

In order to permit broadcasting which involves such special signal processing to be enjoyed, a receiver system must necessarily have such construction as shown in FIG. 3. In particular, referring to FIG. 3, a receiver system must be constructed not only such that a video signal and left (L) and right (R) aural signals demodulated by and outputted from a satellite broadcasting tuner 1 are supplied directly to a monitor apparatus 2 as in a conventional system, but also such that, in order to cope with broadcasting which involves scrambling processing, a signal demodulated by the satellite broadcasting tuner 1 is supplied once to a decoder unit or de-scrambler 3 to de-scramble the same and output signals of the de-scrambler 3 (video signal and L and R aural signals) are supplied to the monitor apparatus 2. In short, broadcasting of a channel which involves scrambling processing cannot be enjoyed without such de-scrambler 3, and accordingly, a receiver system requires two signal input systems to a monitor apparatus 2.

It is to be noted that reference numeral 4 in FIG. 3 denotes a satellite broadcasting antenna, and 5 a satellite broadcasting converter.

By the way, where a receiver system is constructed to cope with scrambled broadcasting in this manner, if scrambled broadcasting is performed with a particular channel, then the monitor apparatus 2 must have two input modes or input terminals for reception of satellite broadcasting of the particular channel and for reception of satellite broadcasting of any other channel which does not involve scrambling processing.

In short, for ordinary satellite broadcasting, a circuit system of the monitor apparatus 2 must be connected so that a signal may be supplied thereto by way of an external input terminal section $T_1$, but for scrambled satellite broadcasting, the circuit system must be connected so that a signal may be supplied by way of the other external input terminal section $T_2$.

Accordingly, when it is tried to change over a receiving channel, for example, from an ordinary satellite broadcasting channel to the scrambled satellite broadcasting channel, an operation of changing over the input mode of the monitor apparatus 2 must be performed together with a channel changing over operation.

Consequently, such problem takes place that a satellite broadcasting channel selecting operation is so complicated that a channel changing over operation cannot be performed particularly by a user who is unfamiliar with such apparatus or does not recognize an input mode of the monitor apparatus 2.

SUMMARY OF THE INVENTION

It is an object of the present invention to provide a satellite broadcasting tuner with which satellite broadcasting of any channel can be enjoyed only by a channel selecting operation thereof whether or not broadcasting of the channel involves special signal processing.

In order to attain the object, according to the present invention, there is provided a satellite broadcasting tuner which comprises demodulating means for demodulating a received satellite broadcasting signal, signal processing means for extracting a video signal and an aural signal from an output of the demodulating means, first external output terminal means for outputting a video signal and an aural signal from the signal processing means to an external apparatus, second external output terminal means for outputting a demodulation output of the demodulating means to an external decoding apparatus, external input terminal means for receiving a video signal and an aural signal from the external decoding apparatus connected to the second external output terminal means, changing over means for alternatively coupling a video signal and an aural signal from the external input terminal means or a video signal and an aural signal from the signal processing means of the first external output terminal means, storage means for storing therein a channel or channels of satellite broadcasting which is broadcast in a specially processed signal form, means for selectively designating a channel of satellite broadcasting, and controlling means for judging whether or not a channel designated by the designating means is the channel or one of the channels stored in the storage means and for controlling the changing over means to alternatively couple a video signal and an aural signal supplied from the external decoding apparatus by way of the external input terminal means to the first external output terminal means when the designated channel is the channel or one of the channels stored in the storage means. The storage means may be a ROM in which a channel or channels of satellite broadcasting which is broadcast in a specially processed signal form are stored in advance.

In the satellite broadcasting tuner, a satellite broadcasting channel or channels of satellite broadcasting which is broadcast in a specially processed signal form such as a scrambled signal form are stored in the storage means. Then, when a satellite broadcasting channel designated by the designating means is the channel or one of the channels stored in the storage means, the changing over means is changed over to a condition wherein a video signal and an aural signal received by way of the external input terminal means from an external decoding apparatus connected to the second external output terminal means are coupled to the first external output terminal means to which such an external apparatus as a monitor apparatus is connected. Consequently, whether a satellite broadcasting a user wants to enjoy is broadcast in a specially processed signal form or not, a satellite broadcasting channel selecting operation is not complicated nor difficult but can be performed by a simple operation of a channel button or the like. Further, only one input signal system is required to be connected to such monitor apparatus. Accordingly, a user who may be unfamiliar with a satellite broadcasting tuner need not be aware of an input mode to the monitor apparatus upon channel selecting operation.

The above and other objects, features and advantages of the present invention will become apparent from the

DETAILED DESCRIPTION OF THE PREFERRED EMBODIMENT

Figure 1:
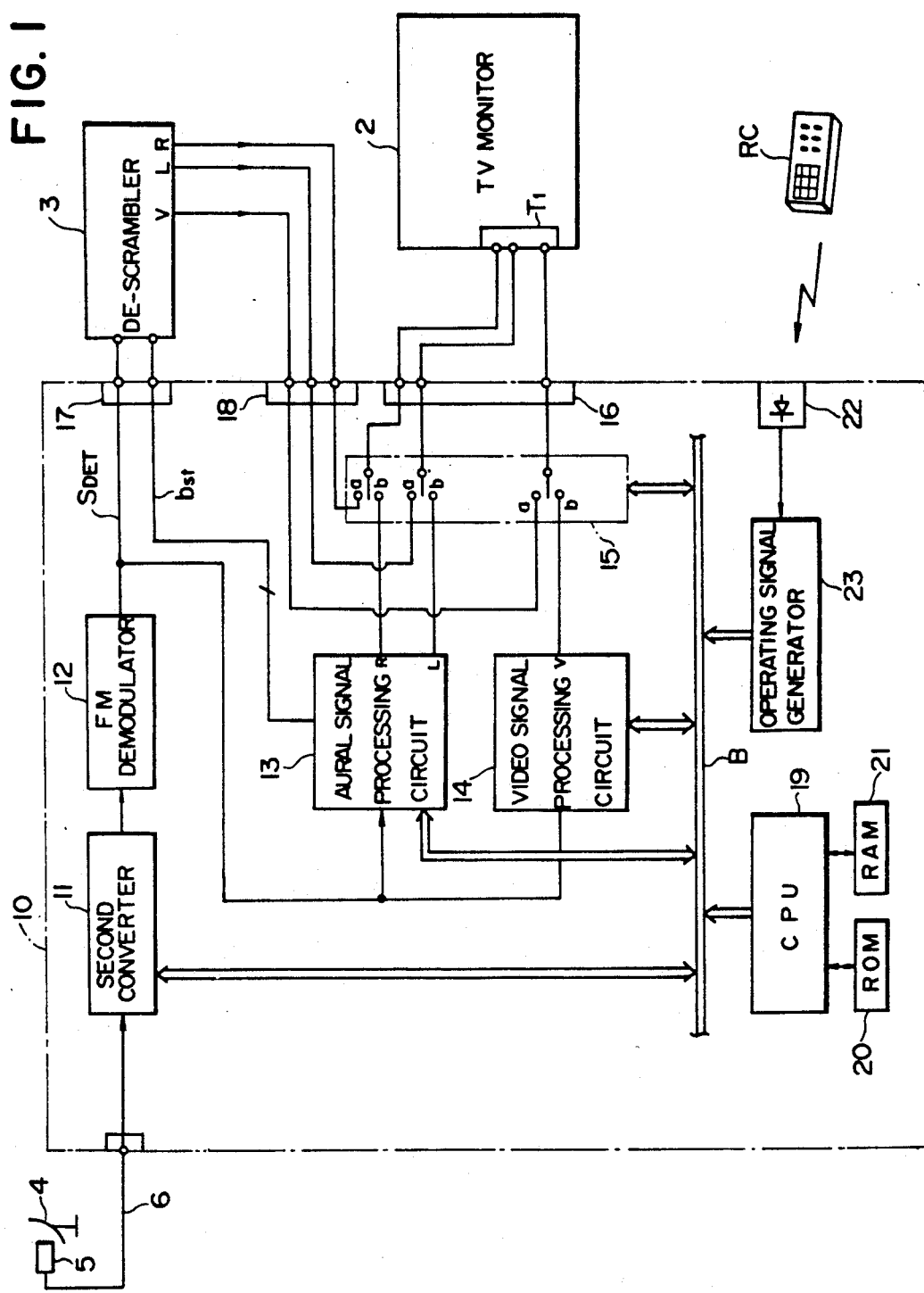
FIG. 1 is a block diagram of a satellite broadcasting tuner showing a preferred embodiment of the present invention.
Figure 3:
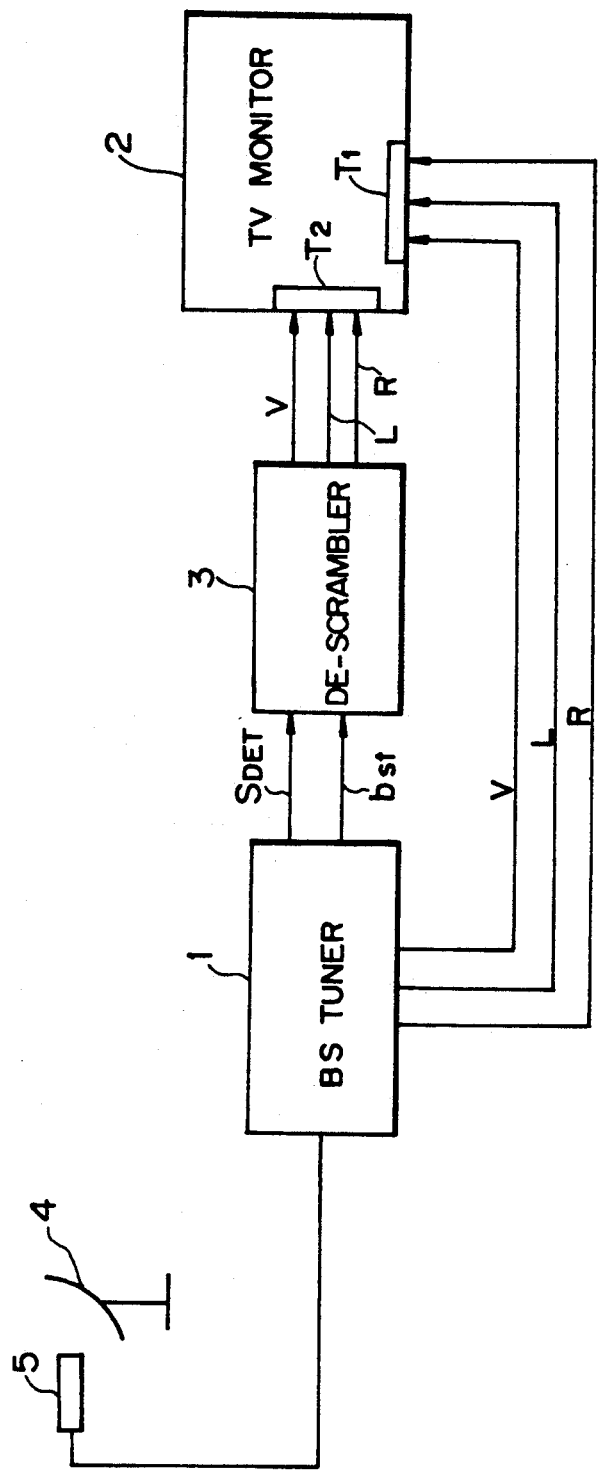
FIG. 3 is a block diagram of a conventional receiver system in which a de-scrambler is connected.

Referring to FIG. 1, there is shown a receiver system in which a satellite broadcasting tuner according to the present invention is incorporated. The receiver system includes, similarly to the conventional receiver system described hereinabove with reference to FIG. 3, a satellite broadcasting tuner 10, a monitor apparatus 2 and a decoder unit or de-scrambler 3. The satellite broadcasting tuner 10 is constructed in accordance with the present invention.

In the receiver system, radio waves of a 12 GHz band received at a satellite broadcasting antenna 4 are converted into a signal of a first intermediate frequency (1.03–1.33 GHz) by a satellite broadcasting converter 5 and then inputted to the satellite broadcasting tuner 10 by way of a coaxial table 6.

The satellite broadcasting tuner 10 includes a second intermediate frequency converting circuit section 11 which selects a desired channel from within received signals of first frequencies supplied thereto from the satellite broadcasting converter 5. A signal of the thus selected channel is converted into another signal of a second intermediate frequency of 134.26 MHz or 402.78 MHz. The signal of the second intermediate frequency is supplied to an FM demodulating circuit section 12, at which it is once processed for amplitude limiting or the like and then FM demodulated.

The thus FM demodulated signal $S_{DET}$ is supplied to an aural signal processing circuit 13 consisting of a 4-phase DPSK demodulating circuit and a PCM demodulating circuit in a known manner to obtain L and R aural signals. The FM demodulated signal $S_{DET}$ is also supplied to a video signal processing circuit 14 consisting of a de-emphasis circuit, an energy dispersal signal removing circuit, a video amplifier circuit and so forth in a known manner to extract a video signal. The thus extracted L and R aural signals and video signal are introduced to an outputting section 16 by way of contacts b of a changing over circuit 15 so that they are supplied to the monitor apparatus 2 by way of wires connected between the outputting section 16 of the satellite broadcasting tuner 10 and an input terminal section $T_1$ of the monitor apparatus 2.

In order to cope with scrambled broadcasting signals, an output terminal section 17 for a detection output $S_{DET}$ outputted from the FM demodulating circuit section 12 and digital control data (bit stream) $b_{st}$ outputted from the aural signal processing circuit 13 is provided for the satellite broadcasting tuner 10 and connected to the de-scrambler 3. Thus, when scrambled broadcasting is to be enjoyed, control data $b_{st}$ for de-scrambling processing and a detection output $S_{DET}$ are supplied to the de-scrambler 3, at which scrambled signals are decoded into original video signal V and L and R aural signals.

The satellite broadcasting tuner 10 further includes an external input terminal section 18 by way of which a video signal V and L and R aural signals outputted from the de-scrambler 3 are inputted to the satellite broadcasting tuner 10. Signals inputted by way of the external input terminal section 18 are supplied to contacts a of the changing over circuit 15.

The satellite broadcasting tuner 10 further includes a system controller or CPU (central processing unit) 19 which controls a channel selecting operation, various signal processing operations and a changing over operation between the contacts a and b of the changing over circuit 15 in accordance with an operation of a user and a control program transmitted by way of a control bus B. Data for such control and the control program are stored in a ROM (read only memory) 20 or a RAM (random access memory) 21.

The satellite broadcasting tuner 10 further includes an infrared rays receiving section 22 for detecting a command signal which is outputted from a remote commander RC in response to a manual operation of the remote commander RC. An infrared rays command signal thus detected is amplified as an electric signal and converted into a digital code by an operating signal generating section 23 and then inputted to the CPU 19 by way of the control bus B. It is to be noted that, also when a panel button or buttons provided on an outer casing not shown of the satellite broadcasting tuner 10 are operated, corresponding operation information is supplied to the CPU 19 similarly.

In the satellite broadcasting tuner 10 having such construction as described above, changing over between the contacts a and b of the changing over circuit 15 must be performed between when ordinary satellite broadcasting is to be enjoyed and when scrambled satellite broadcasting is to be enjoyed.

The satellite broadcasting tuner 10 operates in the following manner to cope with such circumstances.

First, as initialization before use of the receiver system, a channel in which scrambled broadcasting is performed will be registered into the RAM 21 in response to an operation of a user or the like.

For example, if the third and eleventh channels of satellite broadcasting are broadcast in scrambled conditions, then data of "BS-3" and "BS-11" are written into a predetermined address of the RAM 21.

Figure 2:
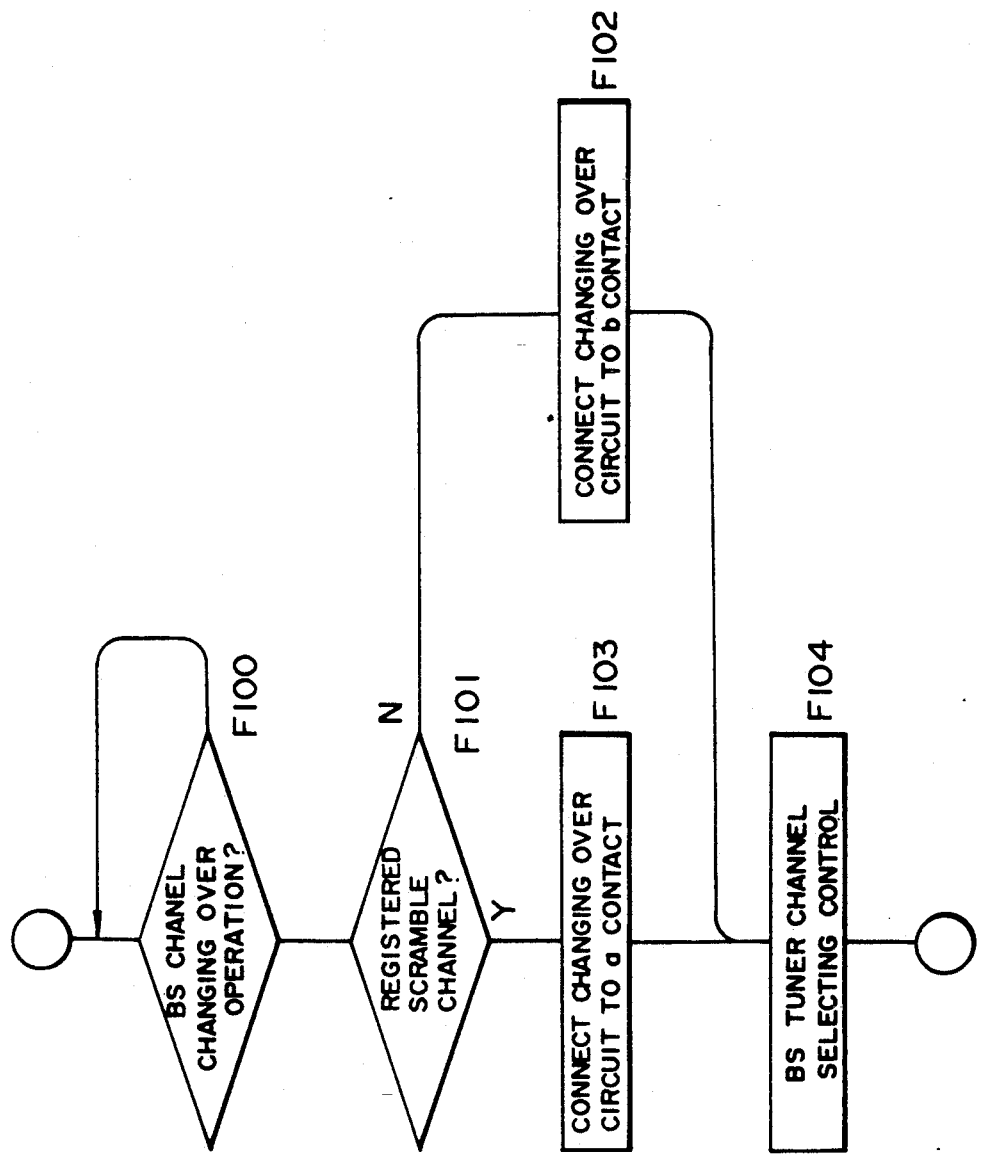
FIG. 2 is a flow chart illustrating controlling operation when a satellite broadcasting channel selecting operation is performed with the satellite broadcasting tuner of FIG. 1.

After execution of such registration, if a satellite broadcasting changing over command is inputted, for example, from the remote commander RC, then the CPU 19 executes such control as illustrated by a flow chart of FIG. 2.

Referring to FIG. 2, after a satellite broadcasting channel command is developed from the remote commander RC and inputted to the CPU 19 at step F100, it is judged first at step F101 whether or not the satellite broadcasting channel is one of the registered channels. If the inputted satellite broadcasting channel is not any registered channel, then the CPU 19 controls the changing over circuit 15 to connect the switches thereof to the contacts b at step F102, and then controls, at step F104, the second intermediate frequency changing over circuit section 11 to select the channel corresponding to the manual operation of the remote commander RC.

However, in case it is judged at step F101 otherwise that the channel corresponding to such manual operation is one of the satellite broadcasting channels (that is, scrambled broadcasting channels) registered in the RAM 21, the CPU 19 controls the changing over circuit 15 to connect the switches thereof to the contacts a at step F103, whereafter it controls, at step F104, the second intermediate frequency changing over circuit section 11 to select the channel corresponding to the manual operation.

As the CPU 19 executes such control as described above, a user of the receiver system can enjoy broadcasting of any satellite broadcasting channel only by a simple channel selecting operation (an operation of a channel up/down button or an operation of a direct channel selecting button) whether or not the broadcasting is scrambled broadcasting. For example, when the channel selection is to be changed over from a BS 7 channel to the BS 11 channel of scrambled broadcasting or when the channel selection is to be changed over from the BS 11 channel to a further BS 15 channel of non-scrambled broadcasting, an input mode changing over operation for the monitor apparatus 2 is unnecessary. Accordingly, even an unfamiliar user will not be bewildered with the operation.

By the way, in case all channels of scrambled broadcasting are known in advance, such information may be registered in the ROM 20 of the satellite broadcasting tuner 10 in advance upon manufacture.

It is to be noted that, while the satellite broadcasting tuner in the embodiment described above is described incorporated in a receiver system adapted to receive scrambled broadcasting, a satellite broadcasting tuner according to the present invention can exhibit similar effects even where it is applied to a receiver system of broadcasting which involves any other special manner of signal processing. For example, while a receiver system adapted to receive broadcasting of the MUSE system requires a MUSE decoder (or, in some cases, a MUSE-NTSC converter), an input mode changing over operation for the monitor apparatus 2 is unnecessary also with such receiver system if an output of such MUSE decoder is received by way of the external input terminal section 13 and a changing over operation of the changing over circuit 15 is performed automatically in accordance with registered channels.

Having now fully described the invention, it will be apparent to one of ordinary skill in the art that many changes and modifications can be made thereto without departing from the spirit and scope of the invention as set forth herein.

What is claimed is:

1. A satellite broadcasting receiving system for use with a television monitor, comprising:
   demodulating means for demodulating a received satellite broadcasting signal;
   video signal processing means for extracting a video signal from an output of said demodulating means;
   aural signal processing means for extracting an aural signal from said output of said demodulating means and for outputting digital control data indicating a scrambled state of said output from said demodulating means;
   first external output terminal means for outputting a video signal and an aural signal from said video signal and aural signal processing means, respectively, to the television monitor;
   an external decoding apparatus;
   second external output terminal means for outputting said output of said demodulating means and said digital control data from said aural signal processing means to said external decoding apparatus;
   external input terminal means for receiving a video signal and an aural signal from the external decoding apparatus connected to said second external output terminal means;
   changing over means for alternatively coupling a video signal and an aural signal from said external input terminal means or a video signal from said video signal processing means and an aural signal from said aural signal processing means to said first external output terminal means;
   storage means for storing therein a channel or channels of satellite broadcasting which is broadcast in a specially processed signal form;
   means for selectively designating a channel of satellite broadcasting; and
   controlling means for judging whether or not a channel designated by said means for selectively designating is the channel or one of the channels stored in said storage means and for controlling said changing over means to alternatively couple a video signal and an aural signal supplied from the external decoding apparatus by way of said external input terminal means through said first external output terminal means to the television monitor when the designated channel is the channel or one of the channels stored in said storage means.

2. A satellite broadcasting tuner according to claim 1, wherein said storage means comprises a ROM in which identification data for a channel or channels of satellite broadcasting which is broadcast in a specially processed signal form are stored in advance.

* * * * *